Figure 1:
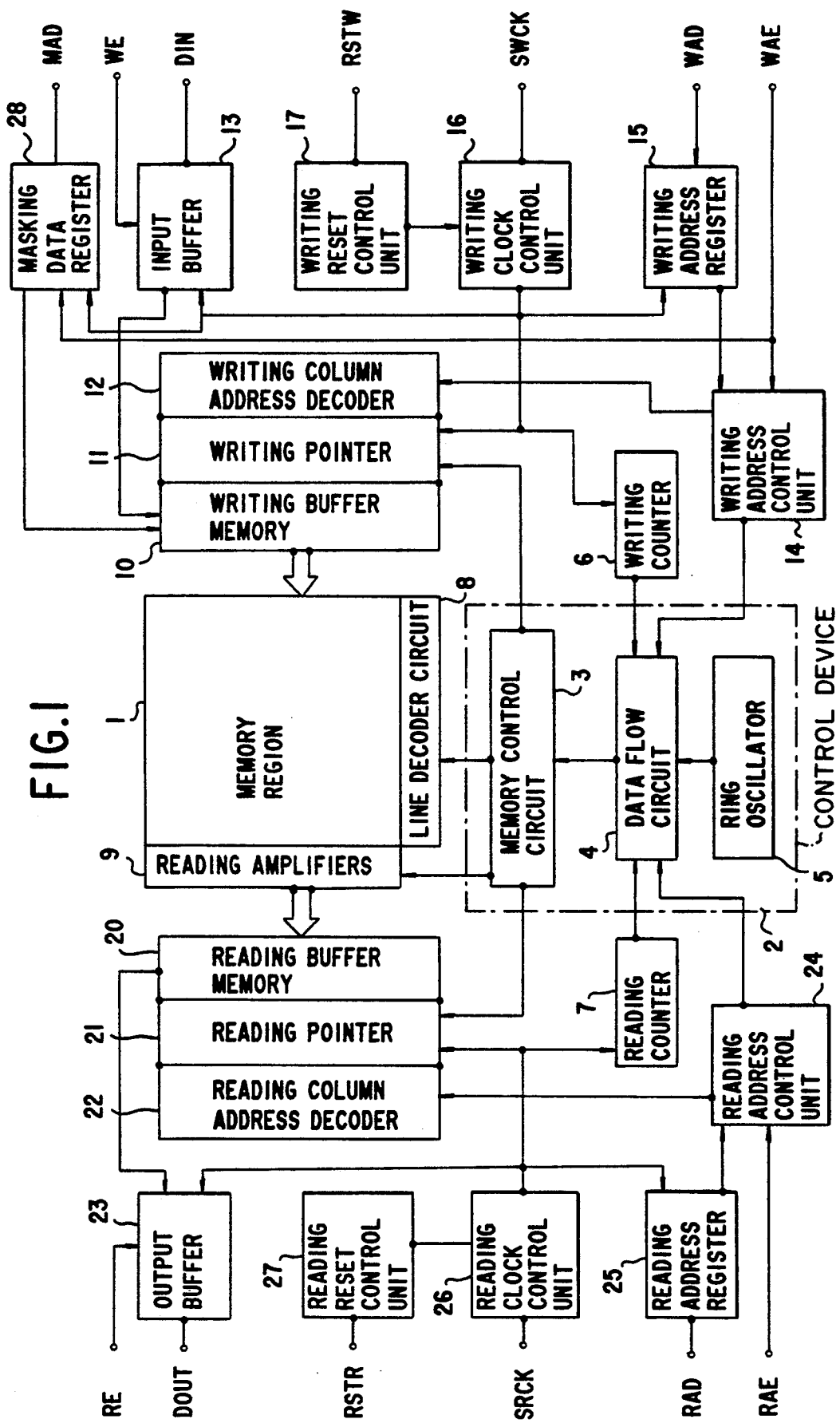

United States Patent [19]

Meyer et al.

[11] Patent Number: 5,329,493
[45] Date of Patent: Jul. 12, 1994

[54] INTEGRATED SEMICONDUCTOR MEMORY ARRAY AND METHOD FOR OPERATING THE SAME

[75] Inventors: Willibald Meyer, Munich; Norbert Wirth, Unterschleissheim, both of Fed. Rep. of Germany

[73] Assignee: Siemens Aktiengesellschaft, Munich, Fed. Rep. of Germany

[21] Appl. No.: 74,329

[22] Filed: Jun. 9, 1993

[30] Foreign Application Priority Data

Jun. 9, 1992 [EP] European Pat. Off. ......... 92109690.5

[51] Int. Cl.[5] .................................................. G11C 13/00
[52] U.S. Cl. ........................... 365/230.01; 365/189.05; 365/230.05; 365/230.09; 365/239
[58] Field of Search ................... 365/189.05, 230.05, 365/230.09, 239

[56] References Cited

U.S. PATENT DOCUMENTS

| | | |
|---|---|---|
| 4,855,959 | 8/1989 | Kobayashi . |
| 4,858,190 | 8/1989 | Yamaguchi . |
| 4,882,710 | 11/1989 | Hashimoto et al. . |
| 5,093,807 | 3/1992 | Hashimoto et al. . |
| 5,214,609 | 5/1993 | Kato et al. ...................... 365/230.08 |

FOREIGN PATENT DOCUMENTS

| | | |
|---|---|---|
| 0135940 | 4/1985 | European Pat. Off. . |
| 0237030 | 9/1987 | European Pat. Off. . |
| 0276870 | 8/1988 | European Pat. Off. . |
| 0385389 | 9/1990 | European Pat. Off. . |
| 0487819 | 6/1992 | European Pat. Off. . |
| 86-207014 | 3/1988 | Japan . |

Primary Examiner—Terrell W. Fears
Attorney, Agent, or Firm—Herbert L. Lerner; Laurence A. Greenberg

[57] ABSTRACT

An integrated semiconductor memory array includes a memory region, a writing buffer memory associated with the memory region, a writing pointer and an input buffer associated with the writing buffer memory, a reading buffer memory associated with the memory region, a reading pointer and an output buffer associated with the reading buffer memory, and a control device being formed of a memory control circuit and a data flow control circuit. A reading column address decoder controlling the reading pointer is associated with the reading buffer memory. A reading address control unit is connected to the reading column address decoder, and a reading address register is connected to the reading address control unit. A writing column address decoder controlling the writing pointer is associated with the writing buffer memory. A writing address control unit is connected to the writing column address decoder, and a writing address register is connected to the writing address control unit. A line address decoder is provided in the memory control circuit or in the memory region and is triggerable by the reading address control unit and the writing address control unit.

16 Claims, 5 Drawing Sheets

INTEGRATED SEMICONDUCTOR MEMORY ARRAY AND METHOD FOR OPERATING THE SAME

The invention relates to an integrated semiconductor memory array, having a memory region organized in lines and columns; a writing buffer memory associated with the memory region for serial-parallel conversion of data to be written in, a writing pointer and an input buffer being associated with the writing buffer memory; a reading buffer memory associated with the memory region for parallel/serial conversion of data to be read out, a reading pointer and an output buffer being associated with the reading buffer memory; and a control device being formed by a memory control circuit and a data flow control circuit for controlling data flow between the memory region and the writing buffer memory on one hand and the reading buffer memory on the other hand.

Such an integrated semiconductor memory array is already known from U.S. Pat. No. 4,882,710. In the memory array described therein, data are written serially into an input buffer by means of a writing clock. From there, the data are read into the writing buffer memory by means of the writing pointer, which is likewise clocked by the writing clock signal, and from there they are transferred in parallel into one of a plurality of subregions of the memory region. Accordingly, upon each data transfer to a memory subregion, one complete column of the subregion is rewritten. Corresponding to the writing process, in reading, the data of one complete line of a memory subregion are transferred to the reading buffer memory. The addressing is performed in such a way that the data first written into that cell are also read out again first. That is, the memory array operates according to the FIFO principle. From the reading buffer memory, the data are then transferred serially into the output buffer by means of the reading pointer clocked by a reading clock signal, and from that buffer are likewise output from the memory array by means of the reading clock signal. Since the memory array operates according to the FIFO principle, it is simple in structure. However, blockwise random access to the memory region, as is desired for picture memories for television, for instance, is not possible.

Published European Application No. 0 135 940 A3 discloses an integrated semiconductor memory array that permits random access to individual memory locations and additionally offers the opportunity of transferring the data from one complete column to a buffer memory, from which the data are then read out serially from a line address to be determined onward.

Such a memory array, operating as RAM, does enable blockwise random access, but only the beginning of a data block is freely selectable by means of the line address to be determined, with the end of the data block in each case being the end of the line, but in that memory array, FIFO operation, which is often practical for television applications, is still not possible.

It is accordingly an object of the invention to provide an integrated semiconductor memory array and a method for operating the same, which overcome the hereinafore-mentioned disadvantages of the heretofore-known devices and methods of this general type and which enable both FIFO operation and blockwise random memory addressing, at least when data are being read or written.

With the foregoing and other objects in view there is provided, in accordance with the invention, an integrated semiconductor memory array, comprising a memory region organized in lines and columns; a writing buffer memory associated with the memory region for serial-parallel conversion of data to be written in, a writing pointer and an input buffer associated with the writing buffer memory; a reading buffer memory associated with the memory region for parallel/serial conversion of data to be read out, a reading pointer and an output buffer associated with the reading buffer memory; and a control device being formed of a memory control circuit and a data flow control circuit for controlling a data flow between the memory region and the writing buffer memory and between the memory region and the reading buffer memory.

According to one embodiment of the invention, there is provided a reading column address decoder controlling the reading pointer and being associated with the reading buffer memory, a reading address control unit connected to the reading column address decoder, and a reading address register connected to the reading address control unit; and a line address decoder being provided in the memory control circuit or in the memory region and being triggerable by the reading address control unit.

According to another embodiment of the invention, there is provided a writing column address decoder controlling the writing pointer and being associated with the writing buffer memory, a writing address control unit connected to the writing column address decoder, and a writing address register connected to the writing address control unit; and a line address decoder being provided in the memory control circuit or in the memory region and being triggerable by the writing address control unit.

In accordance with another feature of the invention, there is provided a writing column address decoder controlling the writing pointer and being associated with the writing buffer memory, a writing address control unit connected to the writing column address decoder, and a writing address register connected to the writing address control unit, the line address decoder being triggered by the writing address control unit.

In accordance with a further feature of the invention, there is provided a masking data register being associated with the writing buffer memory and being triggered by a writing address control signal.

With the objects of the invention in view, there is also provided a method for operating a semiconductor memory array, which comprises reading bits of a writing and/or reading address signal as a writing and/or reading address into the writing and/or reading address register by means of a writing and/or reading clock signal, during an active stage of a writing and/or reading control signal supplied to the writing and/or reading address control unit; activating a writing and/or reading reset signal supplied to the writing and/or reading pointer, no earlier than after a minimum period after a transition of the writing and/or reading control signal to an inactive state; writing in and/or reading out input and/or output data to and/or from a memory region associated with the previously read-in writing and/or reading address, after activation of the writing and/or reading reset signal; again activating the writing and/or reading control signal and thereby reading in a new address, during the process of writing in and/or reading out data; then tripping a new process of writing in and- /or reading out data by a subsequently activated writing and/or reading reset signal, if the writing and/or reading control signal has been reactivated; and incrementing the previously read-in address independently of a new writing and/or reading reset signal, if the writing and/or reading control signal has not been activated.

In accordance with a concomitant mode of the invention, there is provided a method which comprises additionally reading a masking data signal into the masking data register, during the active state of the writing control signal.

Other features which are considered as characteristic for the invention are set forth in the appended claims.

Although the invention is illustrated and described herein as embodied in an integrated semiconductor memory array and a method for operating the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 1 is a block circuit diagram of an integrated semiconductor memory array according to the invention; and FIGS. 2-6 are diagrams showing the course over time of signals at external inputs of the memory array for two different possible writing and reading cycles.

Referring now to the figures of the drawing in detail and first, particularly, to FIG. 1 thereof, there is seen an integrated semiconductor memory array, in which a memory region 1, that may be subdivided into a plurality of subregions, is associated with a control device 2. This control device 2 is constructed with a memory control circuit 3, a data flow control circuit 4, and a ring oscillator 5. The ring oscillator 5 triggers the data flow control circuit 4 if there is no external clock or an external clock is running too slowly, and this circuit 4 in turn triggers the memory control circuit 3, which in turn triggers a line decoder circuit 8 associated with the memory region 1 and reading amplifiers 9 that are also associated with the memory region 1. However, it is equally possible to place the line decoder circuit 8 in the memory control circuit 3.

A writing buffer memory 10 for the serial/parallel conversion of data to be written in, a writing pointer 11 connected to the writing buffer memory 10, and a writing column address decoder 12 that sets the writing pointer 11, are associated with the memory region 1 on the input side.

The writing buffer memory 10 is connected to an input buffer 13, from which it receives written-in input data DIN. This input buffer 13 then serves on one hand to convert the level of the input data DIN and on the other hand to synchronize the input data DIN with a writing clock signal SWCK.

However, besides the serial input for the input data DIN, which may be several bits wide, the input buffer 13 has two further inputs for a writing enable signal WE and for a clock signal which it receives from a writing clock control unit 16. On one hand, this writing clock control unit 16 is acted upon by the writing clock signal SWCK, and on the other hand it furnishes clock signals to the aforementioned input buffer 13, to a writing counter 6 acting upon the data flow control unit 4, to the writing pointer 11, and to a writing address register 15.

The writing clock control unit 16 also receives a signal from a writing reset control unit 17 that is dependent on a writing reset signal RSTW present at an input of the writing reset control unit 17.

The writing address register 15 is provided in FIG. 1 with a serial input for a writing address signal WAD. However, it may equally well be provided with two separate serial inputs for one line and one column address signal, or with parallel inputs for the writing address signal. The writing address register 15 delivers the received addresses to a writing address control unit 14, which in turn delivers the column address to the writing column address decoder 12 and the line address to the data flow control unit 4, which in turn delivers the line address, through the memory control circuit 3, to the line decoder 8 disposed in the memory region 1. The writing address control unit 14 is also provided with an input at which it receives a writing control signal WAE.

The writing buffer memory 10 is acted upon by a masking data register 28 with a signal, so that the input data DIN stored in the writing buffer memory 10 can be masked in accordance with the masking data signal MAD. However, it is also possible to already perform the masking when the input data DIN are written into the writing buffer memory 13, or already in the input buffer 13. The masking data register 28 is acted upon by the writing clock signal SWCK and the writing control signal WAE. The reading in of the masking data signal MAD is controlled with those signals.

In an equivalent manner, a reading buffer memory 20 for the parallel/serial conversion of data to be read out is associated with the memory region 1 on the output side. Connected to this reading buffer memory 20 is a reading pointer 21, which is set by a reading column address decoder 22. The reading pointer 21, a reading counter 7 that triggers the data flow control circuit 4, an output buffer 23 and a reading address register 25, are supplied with a clock signal that originates in a reading clock control unit 26. This clock signal is dependent on a reading clock signal SRCK applied to an input of the reading clock control unit 26. The reading clock control unit 26 also has an input for a signal that originates in a reading reset control unit 27 and that is dependent on a reading reset signal RSTR present at an input to the unit 27.

The reading address register 25 receives a reading address signal RAD at its serial input. This reading address register 25 can likewise alternatively have two separate serial inputs for the line and column address signals, or parallel inputs for the reading address signal RAD.

The reading address RAD is sent from the reading address register 25 to a reading address control unit 24, which supplies the column address to the reading column address decoder 22 and likewise supplies the line address to the data flow control circuit 4. The reading address control unit 24 is also acted upon by a reading control signal RAE. The data transferred from the memory region 1 through the reading amplifiers 9 in parallel into the reading buffer memory 20, are read out of the memory array serially through the output buffer 23 in the form of output data DOUT, as a function of a reading enable signal RE.

The memory array according to the invention can be operated in either the FIFO mode or in a mode with a random block address, as a function of the state of the writing control signal WAE at a certain time or during a certain time range in the writing of the input data DIN and on the state of the reading control signal RAE at a certain time or during a certain time range in the reading of the output data DOUT.

In the FIFO mode, the line addresses are each generated by the writing counter 6 or the reading counter 7, while the writing pointer 11 and the reading pointer 21 are each brought to a fixedly set initial state by means of the writing reset signal RSTW and the reading reset signal RSTR, respectively.

In the mode with a random block address, the writing address control unit 14 and the reading address control unit 24 furnish the line address, while the writing pointer 11 and the reading pointer 21, by means of the writing reset signal RSTW or the reading reset signal RSTR as applicable, are set to the initial state corresponding to the particular column address.

Figure 2:
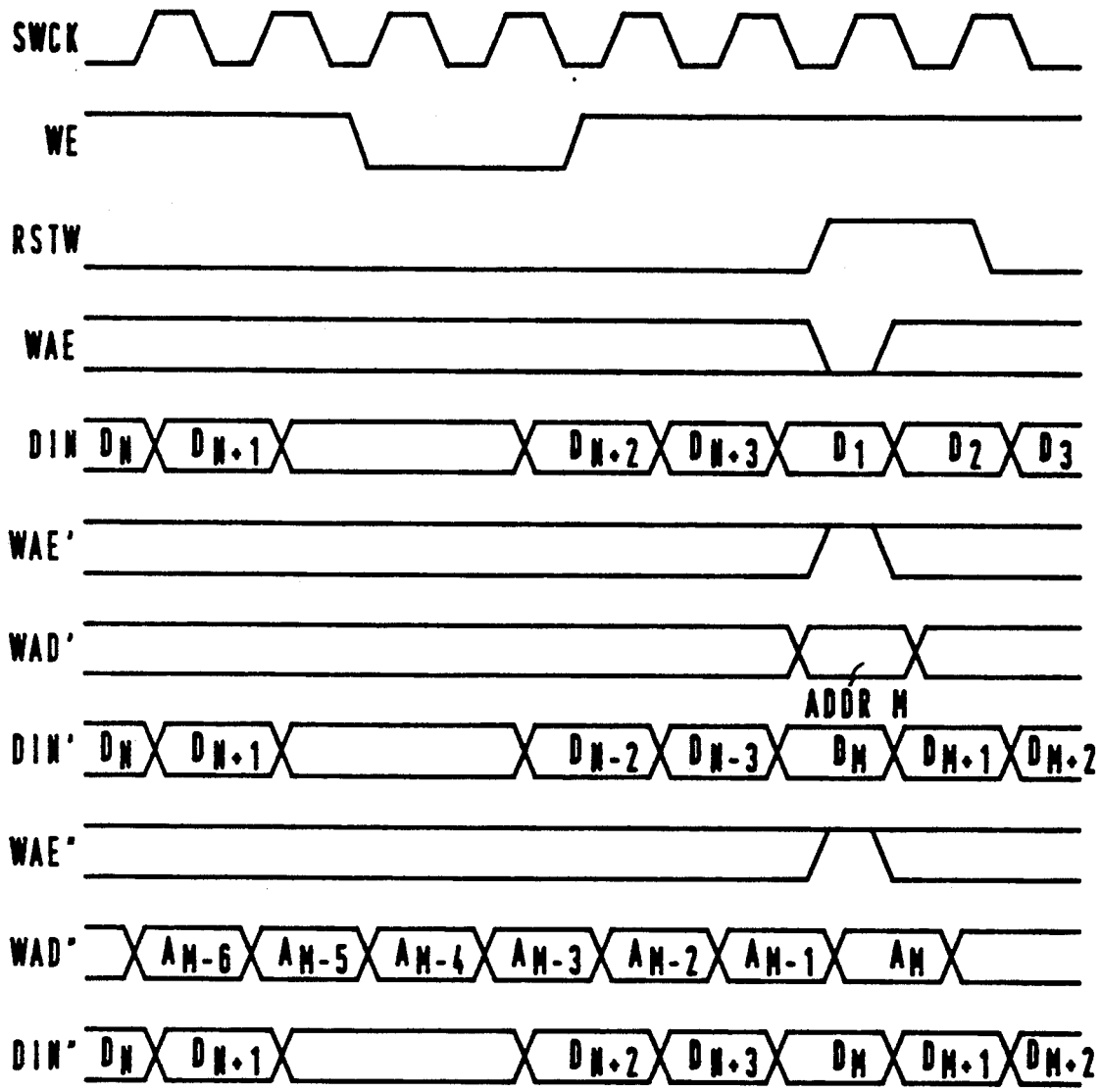

FIG. 2 shows a first possible course over time of the signals to be applied to the memory array from outside, from a writing cycle for the FIFO mode, the mode with a random parallel block address, and a random serial block address, respectively. In all three cases, the input data signal DIN, DIN' and DIN" is written in with the writing clock signal SWCK, if the state of the writing enable signal WE is high. If the writing enable signal WE has a low state, no data are written in. The state of the writing control signal WAE, WAE' and WAE" at a time when the writing reset signal RSTW is in a high state determines the mode in which writing will be performed. In the example of FIG. 2, writing in is carried out in a low state of the writing control signal WAE in the FIFO mode. In other words, the data DIN are written into the writing buffer memory 10 beginning with a first datum $D_1$, from the fixedly set address. However, if the state of the writing control signal WAE' or WAE" is high, then the input data DIN' or DIN" are written into the writing buffer memory 10 beginning with the first datum $D_1$, from a parallel address ADDR M or a serial address . . . $A_{M-6}$ . . . $A_M$ valid at that time.

Figure 3:
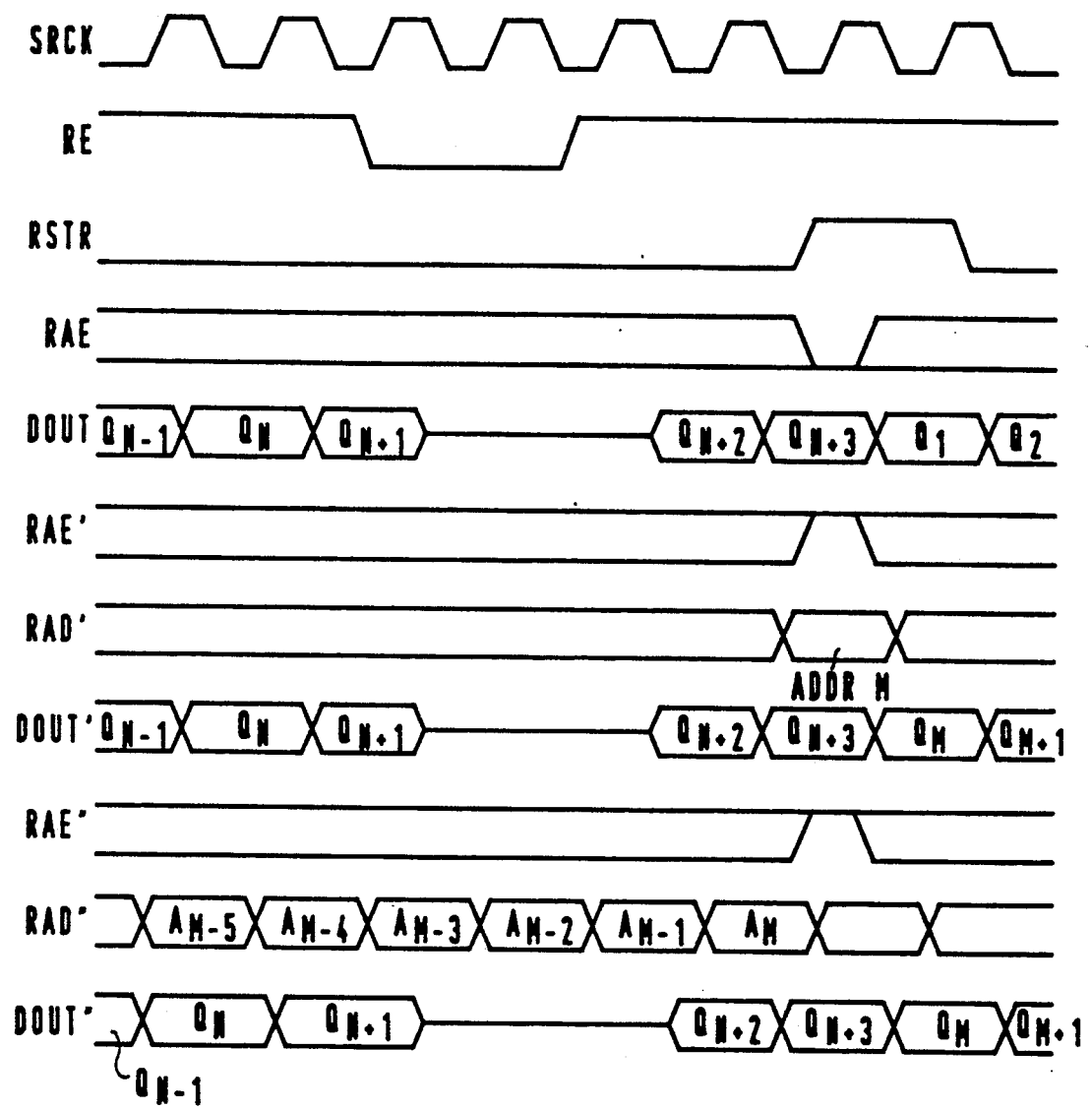

A first possible reading process proceeds in the same way. In the illustration of FIG. 3, the output data DOUT are read out of the reading buffer memory 20 beginning with a datum $Q_1$ of an address 1, at a time when the state of the reading reset signal RSTR is high, the reading control signal RAE has a low state, and the state of the reading enable signal RE is high.

However, if at this time the state of the reading control signal RAE' RAE" is high, the output data DOUT' or DOUT" are read out beginning with a datum QM from an address M of the reading buffer memory 20. The address M is determined by the parallel address ADDR M or by the serial address . . . $A_{M-5}$ . . . $A_M$ of the reading address signal RAD' or RAD".

Both the reading and writing process may be interrupted at an arbitrary time by a new reset signal RSTR, RSTW.

In this way, blockwise random access to the memory region is possible both when data are written and when they are read. Naturally, it is equally possible to enable blockwise, random access only during reading or only during writing of data.

Figure 4:
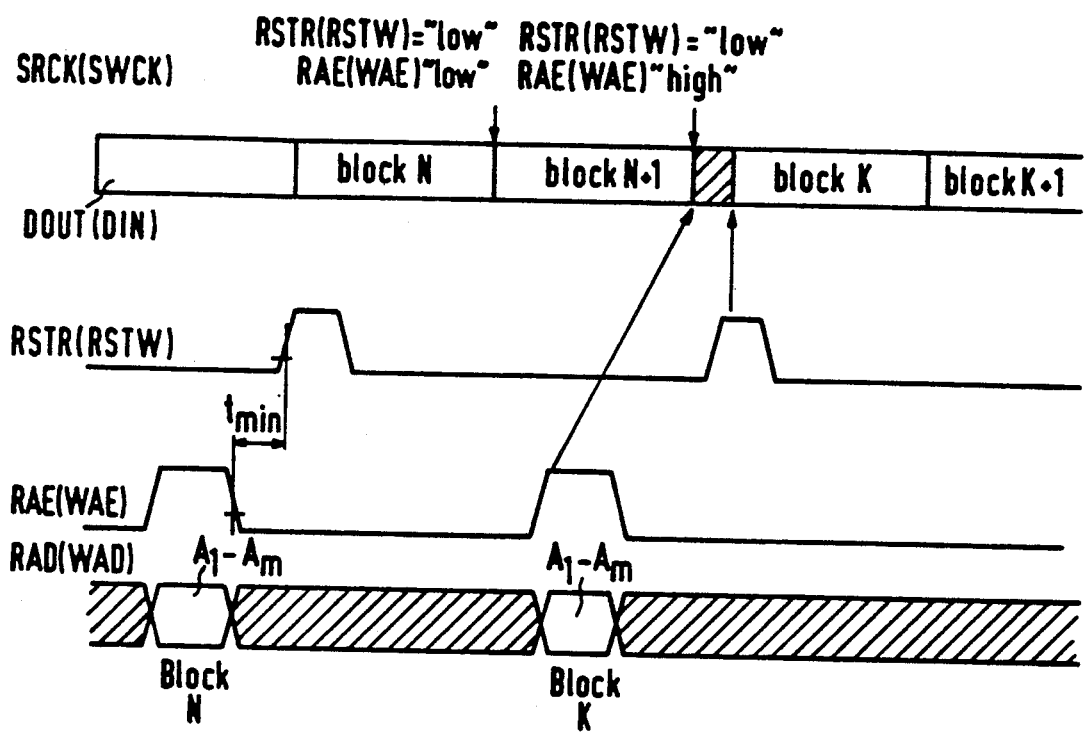

FIG. 4 shows a further preferred option for operating the integrated semiconductor memory array according to the invention. During the active state of the reading control signal RAE or the writing control signal WAE, noting that in FIG. 4 the active state is the high state, address bits $A_1$-$A_n$ of an address, to which a data block is to be written into the memory region, are read in. After a minimum duration $t_{min}$ after the transition of the reading control signal RAE or the writing control signal WAE to the active state, a data block N, which includes the output data DOUT or the input data DIN, is read out or written in with the aid of the reading clock signal SRCK or the writing clock signal SWCK, with a reading reset signal RSTR or a writing reset signal RSTW as applicable. If, as FIG. 4 shows, by the end of the data block N no new active state of the reading or writing control signal RAE or WAE has appeared, then on one hand any reading or writing reset signal RSTR or RSTW that might have appeared is ignored, and on the other hand, the memory device is operated in the FIFO mode. In other words, the address is incremented beginning at the last address read in. That is, a data block N+1 from a memory region is read out or written into that region with an address raised by one.

During the reading out or writing in of the data block N+1 of an active state, if the address bits $A_1$-$A_m$ of a new address are read in for a data block K, then a reading or writing pause occurs at the end of the reading out or writing in of the data block N+1, as long as no reading or writing reset signal RSTR or RSTW has been applied to the semiconductor memory. It is not until a new reading or writing reset signal RSTR or RSTW is applied that the block K then read out or written in, as applicable. If during the reading-out or writing-in process of the data block K, no new address has been read in during an active state of the reading or writing control signal RAE or WAE, then after the data block K a data block K+1 is read out or written in. In other words, the address is raised again by one through the internal reading or writing counter 7 or 6.

Figure 5:
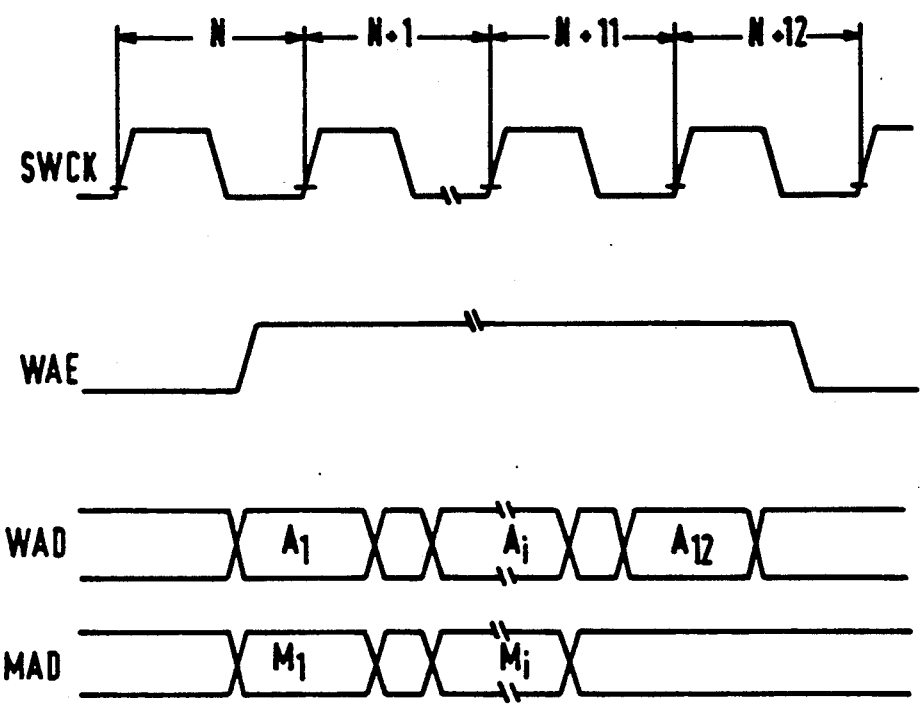

FIG. 5 shows the reading in of a 12-bit address $A_1$ . . . $A_2$ . . . $A_{12}$ in detailed fashion, taking the writing address signal WAD as an example. A reading address RAD is naturally read in in the same way, and the length of a writing or reading address need not be limited to 12 bits. The active state of the writing control signal WAE is the high state, in the example of FIG. 5. However, it may equally well be the low state. After the leading edge of the writing control signal WAE, the first bit $A_1$ of the writing address signal WAD is read in at the next successive leading edge of the writing clock signal SWCK. A further bit $A_1$ of the writing address signal WAD is read in at each further leading edge of the writing clock signal SWCK, through to the last bit $A_{12}$. This is followed by the trailing edge of the writing control signal WAE, which defines the beginning of the minimum duration $t_{min}$.

With the writing address signal WAD, the masking data signal MAD is also read in in the same way as the writing address signal WAD. Although the masking data signal MAD may include an arbitrary number of bits, at maximum it equals the number of address signal bits. For instance, it may include only six bits $n_1$-$n_6$, and each 1 bit $n_i$ of the masking data signal MAD masks a plurality of bits of those bits simultaneously read in in parallel of the input data signal DIN.

Figure 6:
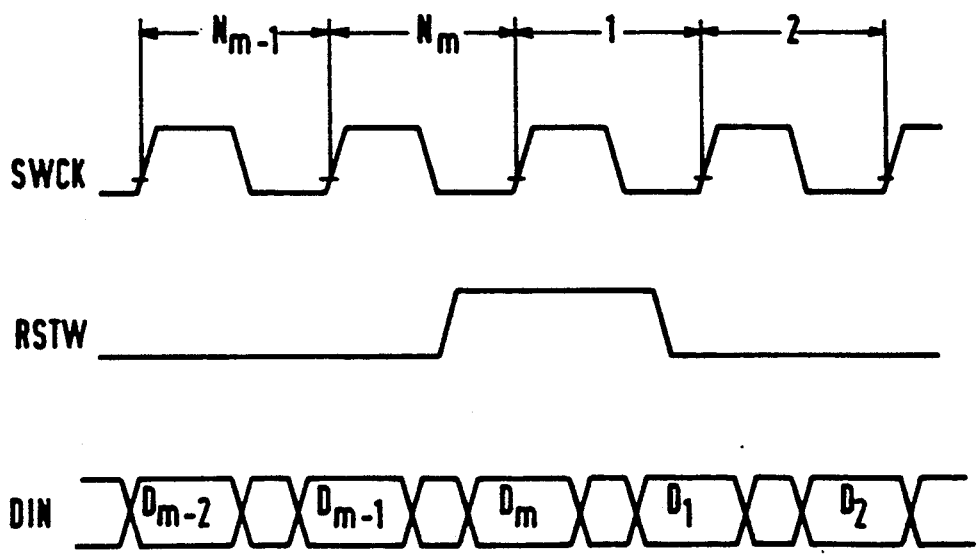

FIG. 6 shows the writing in of input data DIN to a previously read-in writing address. After the minimum duration $t_{min}$ after the trailing edge of the writing control signal WAE has elapsed, then after the transition of the writing reset signal RSTW to the active state, which in FIG. 5 is a high state, after the next leading edge of the writing clock signal SWCK, the first datum $D_1$ of the input data signal DIN is written into the semiconductor memory array. An input signal datum $D_i$ may be several bits wide. Upon each further leading edge, the remaining data of a data block are then written in.

We claim:

1. An integrated semiconductor memory array, comprising:
   a memory region organized in lines and columns;
   a writing buffer memory associated with said memory region for serial-parallel conversion of data to be written in, a writing pointer and an input buffer associated with said writing buffer memory;
   a reading buffer memory associated with said memory region for parallel/serial conversion of data to be read out, a reading pointer and an output buffer associated with said reading buffer memory;
   a control device being formed of a memory control circuit and a data flow control circuit for controlling a data flow between said memory region and said writing buffer memory and between said memory region and said reading buffer memory;
   a reading column address decoder controlling said reading pointer and being associated with said reading buffer memory, a reading address control unit connected to said reading column address decoder, and a reading address register connected to said reading address control unit; and
   a line address decoder being associated with said memory control circuit and said memory region and being triggered by said reading address control unit.

2. The integrated semiconductor memory array according to claim 1, wherein said line address decoder is disposed in said memory control circuit.

3. The integrated semiconductor memory array according to claim 1, wherein said line address decoder is disposed in said memory region.

4. An integrated semiconductor memory array, comprising:
   a memory region organized in lines and columns;
   a writing buffer memory associated with said memory region for serial-parallel conversion of data to be written in, a writing pointer and an input buffer associated with said writing buffer memory;
   a reading buffer memory associated with said memory region for parallel/serial conversion of data to be read out, a reading pointer and an output buffer associated with said reading buffer memory;
   a control device being formed of a memory control circuit and a data flow control circuit for controlling a data flow between said memory region and said writing buffer memory and between said memory region and said reading buffer memory;
   a writing column address decoder controlling said writing pointer and being associated with said writing buffer memory, a writing address control unit connected to said writing column address decoder, and a writing address register connected to said writing address control unit; and
   a line address decoder being associated with said memory control circuit and said memory region and being triggered by said writing address control unit.

5. The integrated semiconductor memory array according to claim 4, wherein said line address decoder is disposed in said memory control circuit.

6. The integrated semiconductor memory array according to claim 4, wherein said line address decoder is disposed in said memory region.

7. The integrated semiconductor memory array according to claim 1, including a writing column address decoder controlling said writing pointer and being associated with said writing buffer memory, a writing address control unit connected to said writing column address decoder, and a writing address register connected to said writing address control unit, said line address decoder being triggered by said writing address control unit.

8. The integrated semiconductor memory array according to claim 4, including a masking data register being associated with said writing buffer memory and being triggered by a writing address control signal.

9. The integrated semiconductor memory array according to claim 7, including a masking data register being associated with said writing buffer memory and being triggered by a writing address control signal.

10. A method for operating a semiconductor memory array having a memory region organized in lines and columns; a writing buffer memory associated with the memory region for serial-parallel conversion of data to be written in, a writing pointer and an input buffer associated with the writing buffer memory; a reading buffer memory associated with the memory region for parallel/serial conversion of data to be read out, a reading pointer and an output buffer associated with the reading buffer memory; a control device being formed of a memory control circuit and a data flow control circuit for controlling a data flow between the memory region and the writing buffer memory and between the memory region and the reading buffer memory; a reading column address decoder controlling the reading pointer and being associated with the reading buffer memory, a reading address control unit connected to the reading column address decoder, and a reading address register connected to the reading address control unit; and a line address decoder being associated with the memory control circuit and the memory region and being triggered by the reading address control unit, which comprises:
   reading bits of a reading address signal as a reading address into the reading address register by means of a reading clock signal, during an active stage of a reading control signal supplied to the reading address control unit;
   activating a reading reset signal supplied to the reading pointer, no earlier than after a minimum period after a transition of the reading control signal to an inactive state;
   reading out output data from a memory region associated with the previously read address, after activation of the reading reset signal;
   possibly again activating the reading control signal and thereby reading in a new address, during the process of reading out data;
   then tripping a new process of reading out data by a subsequently activated reading reset signal, if the reading control signal has been reactivated; and
   incrementing the previously read-in address independently of a new reading reset signal, if the reading control signal has not been activated.

11. A method for operating a semiconductor memory array having a memory region organized in lines and columns; a writing buffer memory associated with the memory region for serial-parallel conversion of data to be written in, a writing pointer and an input buffer associated with the writing buffer memory; a reading buffer memory associated with the memory region for parallel/serial conversion of data to be read out, a reading pointer and an output buffer associated with the reading buffer memory; a control device being formed of a memory control circuit and a data flow control circuit for controlling a data flow between the memory region and the writing buffer memory and between the memory region and the reading buffer memory; a writing column address decoder controlling the writing pointer and being associated with the writing buffer memory, a writing address control unit connected to the writing column address decoder, and a writing address register connected to the writing address control unit; and a line address decoder being associated with the memory control circuit and the memory region and being triggered by the writing address control unit, which comprises:

reading bits of a writing address signal as a writing address into the writing address register by means of a writing clock signal, during an active stage of a writing control signal supplied to the writing address control unit;

activating a writing reset signal supplied to the writing pointer, no earlier than after a minimum period after a transition of the writing control signal to an inactive state;

writing in input data to a memory region associated with the previously read-in writing address, after activation of the writing reset signal;

possibly again activating the writing control signal and thereby reading in a new address, during the process of writing in data;

then tripping a new process of writing in data by a subsequently activated writing reset signal, if the writing control signal has been reactivated; and incrementing the previously read-in address independently of a new writing reset signal, if the writing control signal has not been activated.

12. A method for operating a semiconductor memory array having a memory region organized in lines and columns; a writing buffer memory associated with the memory region for serial-parallel conversion of data to be written in, a writing pointer and an input buffer associated with the writing buffer memory; a reading buffer memory associated with the memory region for parallel/serial conversion of data to be read out, a reading pointer and an output buffer associated with the reading buffer memory; a control device being formed of a memory control circuit and a data flow control circuit for controlling a data flow between the memory region and the writing buffer memory and between the memory region and the reading buffer memory; a reading column address decoder controlling the reading pointer and being associated with the reading buffer memory, a reading address control unit connected to the reading column address decoder, and a reading address register connected to the reading address control unit; a line address decoder being associated with the memory control circuit and the memory region and being triggered by the reading address control unit; a writing column address decoder controlling the writing pointer and being associated with the writing buffer memory; a writing address control unit connected to the writing column address decoder; and a writing address register connected to the writing address control unit; the line address decoder being triggered by the writing address control unit, which comprises:

reading bits of writing and reading address signals as a writing and reading addresses into the writing and reading address registers by means of writing and reading clock signals, during an active stage of writing and reading control signals supplied to the writing and reading address control units;

activating writing and reading reset signals supplied to the writing and reading pointers, no earlier than after a minimum period after a transition of the writing and reading control signals to an inactive state;

writing in and reading out input and output data to and from a memory region associated with the previously read-in writing and reading addresses, after activation of the writing and reading reset signals;

possibly again activating the writing and reading control signals and thereby reading in a new address, during the process of writing in and reading out data;

then tripping a new process of writing in and reading out data by subsequently activated writing and reading reset signals, if the writing and reading control signals have been reactivated; and incrementing the previously read-in address independently of new writing and reading reset signals, if the writing and reading control signals have not been activated.

13. The method for operating a semiconductor memory array according to claim 11, wherein the memory array includes a masking data register being associated with the writing buffer memory, which comprises triggering the masking data register with the writing address control signal.

14. The method for operating a semiconductor memory array according to claim 12, wherein the memory array includes a masking data register being associated with the writing buffer memory, which comprises triggering the masking data register with the writing address control signal.

15. The method for operating a semiconductor memory array according to claim 13, which comprises additionally reading a masking data signal into the masking data register, during the active state of the writing control signal.

16. The method for operating a semiconductor memory array according to claim 14, which comprises additionally reading a masking data signal into the masking data register, during the active state of the writing control signal.

* * * * *